(12) United States Patent
Hsu et al.

(10) Patent No.: US 10,129,974 B2
(45) Date of Patent: Nov. 13, 2018

(54) MULTI-LAYER CIRCUIT STRUCTURE

(71) Applicants: Industrial Technology Research Institute, Hsinchu (TW); First Hi-tec Enterprise Co., Ltd., Taoyuan (TW); NEXCOM International Co., Ltd., New Taipei (TW)

(72) Inventors: Chien-Min Hsu, Hsinchu County (TW); Min-Lin Lee, Hsinchu (TW); Huey-Ru Chang, Hsinchu County (TW); Hung-I Liu, New Taipei (TW); Ching-shan Chang, New Taipei (TW)

(73) Assignees: Industrial Technology Research Institute, Hsinchu (TW); First Hi-tec Enterprise Co., Ltd., Taoyuan (TW); NEXCOM International Co., Ltd., New Taipei (TW)

( * ) Notice: Subject to any disclaimer, the term of this patent is extended or adjusted under 35 U.S.C. 154(b) by 51 days.

(21) Appl. No.: 15/245,202

(22) Filed: Aug. 24, 2016

(65) Prior Publication Data
US 2017/0273174 A1    Sep. 21, 2017

Related U.S. Application Data

(60) Provisional application No. 62/310,826, filed on Mar. 21, 2016.

(51) Int. Cl.
*H01P 3/08*    (2006.01)
*H05K 1/02*    (2006.01)
*H05K 1/11*    (2006.01)

(52) U.S. Cl.
CPC ............. *H05K 1/0245* (2013.01); *H01P 3/08* (2013.01); *H05K 1/0251* (2013.01); *H05K 1/111* (2013.01);
(Continued)

(58) Field of Classification Search
CPC .... H05K 1/0245; H05K 1/0251; H05K 1/111; H05K 1/115; H05K 2201/09627;
(Continued)

(56) References Cited

U.S. PATENT DOCUMENTS 6,677,831 B1   1/2004   Cheng et al.
7,088,200 B2   8/2006   Bartley et al.
(Continued)

FOREIGN PATENT DOCUMENTS

CN    101651266    2/2010
TW    I407461      9/2013
(Continued)

OTHER PUBLICATIONS

"Office Action of Taiwan Counterpart Application," dated Apr. 19, 2017, p. 1-p. 5.

*Primary Examiner* — Stephen E. Jones
(74) *Attorney, Agent, or Firm* — JCIPRNET

(57) ABSTRACT

A multi-layer circuit structure includes a differential transmission line pair and at least one conductive pattern. The differential transmission line pair includes first and second transmission lines disposed side by side. Each of the first and second transmission lines includes first and second segments connected to each other. An spacing between the two first segments is non-fixed, and an spacing between the two second segments is fixed. A first zone is located between the two first segments, a second zone is opposite to the first zone and located outside the first segment of the first transmission line, and a third zone is opposite to the first zone and located outside the first segment of the second transmission line. The conductive pattern is coplanar with the differential transmission line pair and disposed on at least one of the first, second and third zones. The conductive pattern is electrically con-
(Continued)

nected to a reference potential and electrically insulated from the differential transmission line pair.

14 Claims, 8 Drawing Sheets

(52) U.S. Cl.
CPC ... *H05K 1/115* (2013.01); *H05K 2201/09509* (2013.01); *H05K 2201/09545* (2013.01); *H05K 2201/09618* (2013.01); *H05K 2201/09627* (2013.01)

(58) Field of Classification Search
CPC .......... H05K 2201/09509; H05K 2201/09518; H05K 2201/09527; H01P 3/08; H01P 3/081; H01P 3/082; H03H 7/38
USPC ....... 333/33, 4, 260, 246, 247, 254
See application file for complete search history.

(56) References Cited

U.S. PATENT DOCUMENTS

| | | |
|---|---|---|
| 2007/0144773 A1 | 6/2007 | Saitou et al. |
| 2008/0290967 A1 | 11/2008 | Tong et al. |
| 2013/0175078 A1* | 7/2013 | Pai .......................... H05K 1/11 174/264 |
| 2014/0285280 A1 | 9/2014 | Chuo et al. |

FOREIGN PATENT DOCUMENTS

| | | |
|---|---|---|
| TW | 201409820 | 3/2014 |
| TW | 201538040 | 10/2015 |

\* cited by examiner

MULTI-LAYER CIRCUIT STRUCTURE

CROSS-REFERENCE TO RELATED APPLICATION

This application claims the priority benefits of U.S. provisional application Ser. No. 62/310,826, filed on Mar. 21, 2016. The entirety of the above-mentioned patent application is hereby incorporated by reference herein and made a part of this specification.

TECHNICAL FIELD

The present disclosure relates to a multi-layer circuit structure, and more particularly, to a differential transmission circuit structure.

BACKGROUND

With advancements in technologies, the demand on high signal transmission speed has become increasingly more. Currently, a high speed signal is usually transmitted through a differential transmission in high speed. The so-called differential transmission refers to a method for making current flow inversely in two transmission lines while conducting transmission with use of a potential difference between the transmission lines, which can provide the advantage of strong anti-interference capability.

FIG. 1 is a schematic partial view of a conventional multi-layer circuit structure. FIG. 2 is a schematic partial top view of the multi-layer circuit structure of FIG. 1. It should be noted that, FIG. 1 merely illustrates a part of differential transmission related circuits for simplicity of drawing, in which dielectric layers or other circuits among circuits on different planes are omitted. Further, because the differential transmission related circuits are located on the different planes, the circuits located on a lower plane are illustrated by dotted lines in the top view of FIG. 2, so the circuits on the different planes may be distinguished.

Referring to FIG. 1 and FIG. 2, a conventional multi-layer circuit structure 10 includes two differential transmission line pairs 11a and 11b, two pairs of differential pads 18a and 18b, and two plated through vias 19 and 20. The two differential transmission line pairs 11a and 11b are located on different planes and electrically connected to each other through the differential pads 18a and 18b and the plated through vias 19 and 20.

As shown in FIG. 1 and FIG. 2, the differential transmission line pair 11a includes a first transmission line 12a and a second transmission line 15a disposed side by side. The first transmission line 12a includes a first segment 13a and a second segment 14a connected to each other, and the second transmission line 15a includes a first segment 16a and a second segment 17a connected to each other. The differential transmission line pair 11b includes a first transmission line 12b and a second transmission line 15b disposed side by side. The first transmission line 12b includes a first segment 13b and a second segment 14b connected to each other, and the second transmission line 15b includes a first segment 16b and a second segment 17b connected to each other.

As restricted by the difference of the minimum spacings S2, S4 and the minimum interval D in production of the circuit and the plated through vias, an spacing S1 between the two first segments 13a and 16a is non-fixed and an spacing S2 between the two second segments 14a and 17a is fixed in the differential transmission line pair 11a so the circuit layout of Y-junction is formed, for example. A spacing S3 between the two first segments 13b and 16b is non-fixed and a spacing S4 between the two second segments 14b and 17b is fixed in the differential transmission line pair 11b so the circuit layout of Y-junction is formed, for example. A minimum distance (minimum interval) D between the two plated through vias 19 and 20 is normally different from (e.g., greater than) a spacing S2 between the second segment 14a of the first transmission line 12a and the second segment 17a of the second transmission line 15a in the differential transmission line pair 11a. The minimum distance D between the two plated through vias 19 and 20 is normally different from (e.g., greater than) a spacing S4 between the second segment 14b of the first transmission line 12b and the second segment 17b of the second transmission line 15b in the differential transmission line pair 11b. However, because the non-fixed spacings S1, S3 of segments exist between the first transmission line 12a and the second transmission line 15a and between the first transmission line 12b and the second transmission line 15b, the impedance changes as the spacing becomes different. Accordingly, signal transmission loss will increase to lower signal transmission quality.

SUMMARY

The present disclosure provides a multi-layer circuit structure, which can provide a more preferable impedance matching.

The multi-layer circuit structure of the present disclosure includes a differential transmission line pair and at least one conductive pattern. The differential transmission line pair includes a first transmission line and a second transmission line disposed side by side. Each of the first transmission line and the second transmission line includes a first segment and a second segment connected to each other. A spacing between the first segment of the first transmission line and the first segment of the second transmission line is non-fixed. A spacing between the second segment of the first transmission line and the second segment of the second transmission line is fixed. A first zone is located between the first segment of the first transmission line and the first segment of the second transmission line. A second zone is opposite to the first zone and located on one side the first segment of the first transmission line. A third zone is opposite to the first zone and located on one side of the first segment of the second transmission line. The conductive pattern is coplanar with the differential transmission line pair and disposed on at least one of the first, second and third zones. The conductive pattern is electrically connected to a reference potential and electrically insulated from the differential transmission line pair.

Based on the above, in the differential transmission line pairs of the multi-layer circuit structure according to the present disclosure, the spacing between the first segment of the first transmission line and the first segment of the second transmission line is non-fixed, a region between the first segment of the first transmission line and the first segment of the second transmission line is defined as the first zone, a region opposite to the first zone and located on one side of the first segment of the first transmission line is defined as the second zone, and a region opposite to the first zone and located on one side of the first segment of the second transmission line is defined as the third zone. Then, by disposing the conductive pattern on at least one of the first zone, the second zone and the third zone of the differential transmission line pair where the conductive pattern is electrically connected to the reference potential and electrically insulated from the differential transmission line pair, an impedance control at the segments of the differential transmission line pair having the non-fixed spacing may be improved. As a result, the effects of reducing impedance discontinuity, lowering high frequency signal reflection and improving signal integrity may be achieved.

To make the above features and advantages of the present disclosure more comprehensible, several embodiments accompanied with drawings are described in detail as follows.

DETAILED DESCRIPTION

Figure 3:
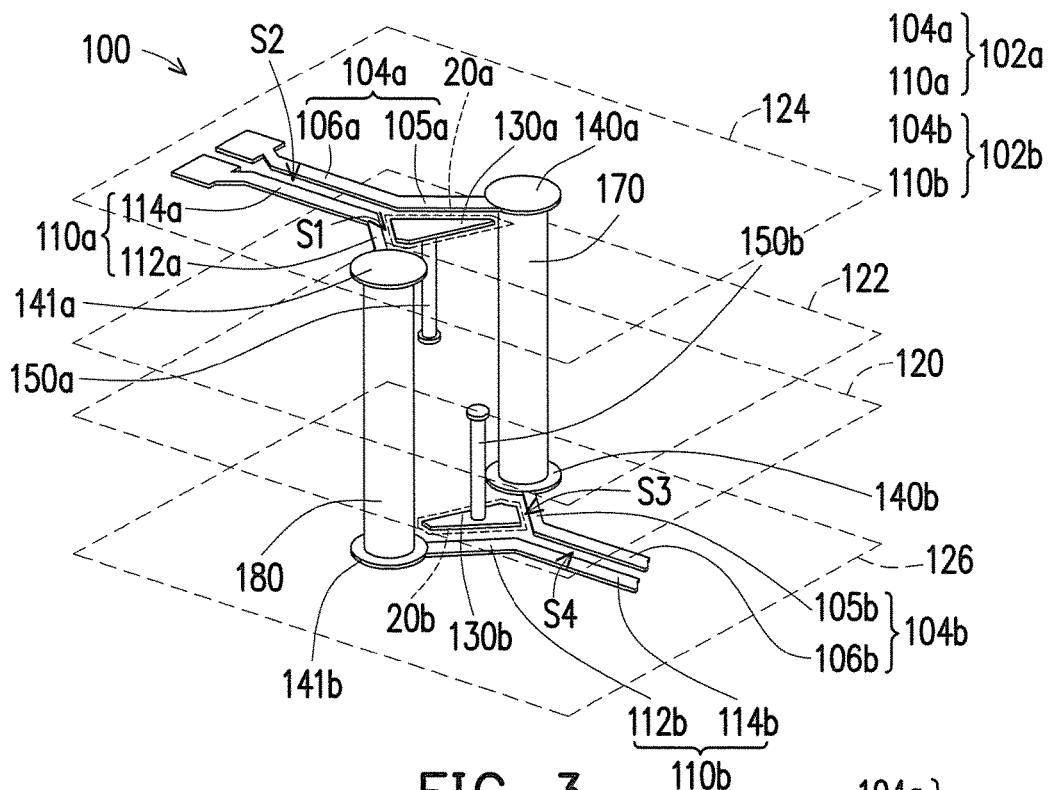
FIG. 3 is a schematic partial view of a multi-layer circuit structure according to an embodiment of the present disclosure.

FIG. 3 is a schematic partial view of a multi-layer circuit structure according to an embodiment of the present disclosure. It should be noted that, FIG. 3 merely illustrates a part of differential transmission related circuits and reference planes for simplicity of drawing, in which dielectric layers or other circuits among circuits on different planes are omitted. Referring to FIG. 3, a multi-layer circuit structure 100 of the present embodiment includes two differential transmission line pairs 102a and 102b, two first differential pads 140a and 140b, two second differential pads 141a and 141b, two plated through vias 170 and 180, two conductive patterns 130a and 130b and two blind vias 150a and 150b.

More specifically, one of the differential transmission line pairs (102a), one of the first differential pads (140a), one of the second differential pads (141a) and one of the conductive patterns (130a) are located in one circuit layer (e.g., on a plane 124 at upper side of FIG. 3). Another one of the differential transmission line pairs (102b), another one of the first differential pads (140b), another one of the second differential pads (141b) and another one of the conductive patterns (130b) are located in another circuit layer (e.g., on a plane 126 at lower side of FIG. 3).

The differential transmission line pair 102a at upper side includes a first transmission line 104a and a second transmission line 110a disposed side by side. The first transmission line 104a includes a first segment 105a and a second segment 106a connected to each other, and the second transmission line 110a includes a first segment 112a and a second segment 114a connected to each other. A spacing S1 between the first segment 105a of the first transmission line 104a and the first segment 112a of the second transmission line 110a is non-fixed. The differential transmission line pair 102b at lower side includes a first transmission line 104b and a second transmission line 110b disposed side by side. The first transmission line 104b includes a first segment 105b and a second segment 106b connected to each other, and the second transmission line 110b includes a first segment 112b and a second segment 114b connected to each other. A spacing S3 between the first segment 105b of the first transmission line 104b and the first segment 112b of the second transmission line 110b is non-fixed.

More specifically, in the present embodiment, the spacing S1 between the first segment 105a of the first transmission line 104a and the first segment 112a of the second transmission line 110a increases when being farther away from the second segment 106a of the first transmission line 104a and the second segment 114a of the second transmission line 110a, and the spacing S3 between the first segment 105b of the first transmission line 104b and the first segment 112b of the second transmission line 110b increases when being farther away from the second segment 106b of the first transmission line 104b and the second segment 114b of the second transmission line 110b. Further, a spacing S2 between the second segment 106a of the first transmission line 104a and the second segment 114a of the second transmission line 110a is fixed, and a spacing S4 between the second segment 106b of the first transmission line 104b and the second segment 114b of the second transmission line 110b is fixed.

The first differential pad 140a and the second differential pad 141a are connected to the first segment 105a of the first transmission line 104a and the first segment 112a of the second transmission line 110a on the same plane, respectively. The first differential pad 140b and the second differential pad 141b are connected to the first segment 105b of the first transmission line 104b and the first segment 112b of the second transmission line 110b on the same plane, respectively. The first differential pads 140a and 140b on different planes are electrically connected to each other through the plated through via 170. The second differential pads 141a and 141b on different planes are electrically connected to each other through the plated through via 180.

As restricted by the difference in production of the differential transmission line pairs 102a and 102b and the plated through vias 170 and 180, a minimum interval between the two plated through vias 170 and 180 is different from a spacing S2 between the second segment 106a of the first transmission line 104a and the second segment 114a of the second transmission line 110a and a spacing S4 between the second segment 106b of the first transmission line 104b and the second segment 114b of the second transmission line 110b. In the present embodiment, the spacing S1 between the first segment 105a of the first transmission line 104a and the first segment 112a of the second transmission line 110a increases when being farther away from the second segment 106a of the first transmission line 104a and the second segment 114a of the second transmission line 110a, and an interval D between the first differential pad 140a and the second differential pad 141a is greater than the spacing S2 between the second segment 106a of the first transmission line 104a and the second segment 114a of the second transmission line 110a. As such, the first transmission line 104a and the second transmission line 110a are in form of the circuit structure of Y-junction. The non-fixed spacing S1 between the first segment 105a of the first transmission line 104a and the first segment 112a of the second transmission line 110a changes the impedances of the differential transmission lines to cause an impedance mismatching issue.

Similarly, the spacing S3 between the first segment 105b of the first transmission line 104b and the first segment 112b of the second transmission line 110b increases when being farther away from the second segment 106b of the first transmission line 104b and the second segment 114b of the second transmission line 110b, and an interval between the first differential pad 140b and the second differential pad 141b is greater than the spacing S4 between the second segment 106b of the first transmission line 104b and the second segment 114b of the second transmission line 110b. As such, the first transmission line 104b and the second transmission line 110b are in form of the circuit structure of Y-junction. The non-fixed spacing S3 between the first segment 105b of the first transmission line 104b and the first segment 112b of the second transmission line 110b changes the impedances of the differential transmission lines to cause the impedance mismatching issue.

Intentionally, in the multi-layer circuit structure 100 of the present embodiment, the conductive pattern 130a is disposed beside the first segment 105a of the first transmission line 104a and the first segment 112a of the second transmission line 110a, and the conductive pattern 130b is disposed beside the first segment 105b of the first transmission line 104b and the first segment 112b of the second transmission line 110b, so as to solve the impedance mismatching issue as described above. It should be noted that, the manner of the non-fixed spacings S1, S3 between the first segment (105a, 105b) of the first transmission line (104a, 104b) and the first segment (112a, 112b) of the second transmission line (110a, 110b) is not limited to the above. In other embodiments, it is also possible that the interval D between the first differential pad 140a and the second differential pad 141a is less than the spacing S2 between the second segment 106a of the connected first transmission line 104a and the second segment 114a of the second transmission line 110a. As such, the interval between the first differential pad 140b and the second differential pad 141b is less than the spacing S4 between the second segment 106b of the connected first transmission line 104b and the second segment 114b of the connected second transmission line 110b, and the spacings S1, S3 between the first segment (105a, 105b) of the first transmission line (104a, 104b) and the first segment (112a, 112b) of the second transmission line (110a, 110b) decreases when being farther away from the second segment (106a, 106b) of the first transmission line (104a, 104b) and the second segment (114a, 114b) of the second transmission line (110a, 110b). The above configuration may also cause the impedance mismatching issue.

In the present embodiment, a first zone 20a is located between the first segment 105a of the first transmission line 104a and the first segment 112a of the second transmission line 110a, and the conductive pattern 130a is located on the first zone 20a of the differential transmission line pair 102a coplanar therewith and electrically insulated from the differential transmission line pair 102a. Since the two first segments 105a and 112a are close to a V shape, an outline of the conductive pattern 130a corresponds to outlines of the two first segments 105a and 112a to show a shape close to a triangular shape, and the outline of the conductive pattern 130a also shows a curved outline at positions close to the first differential pads 140a and 141a. As such, the conductive pattern 130a can maintain the same spacing with each of the first segment 105a of the first transmission line 104a, the first segment 112a of the second transmission line 110a, the first differential pad 140a and the second differential pad 141a. A first zone 20b is located between the first segment 105b of the first transmission line 104b and the first segment 112b of the second transmission line 110b, and the conductive pattern 130b is located on the first zone 20b of the differential transmission line pair 102b coplanar therewith and electrically insulated from the differential transmission line pair 102b. Since the two first segments 105b and 112b are close to a V shape, an outline of the conductive pattern 130b corresponds to outlines of the two first segments 105b and 112b to show a shape close to a triangular shape, and the outline of the conductive pattern 130b also shows a curved outline at positions close to the first differential pads 140b and 141b. As such, the conductive pattern 130b can maintain the same spacing with each of the first segment 105b of the first transmission line 104b, the first segment 112b of the second transmission line 110b, the first differential pad 140b and the second differential pad 141b.

In the present embodiment, the multi-layer circuit structure 100 further includes at least one reference plane (120, 122; represented by a dotted line plane), and the reference plane (120, 122) has a reference potential. More specifically, the multi-layer circuit structure 100 includes two reference planes 120 and 122, and the two conductive patterns 130a and 130b located on different planes are electrically connected to the two reference planes 120 and 122 (the reference potential) through the two blind vias 150a and 150b, respectively. The reference planes 120 and 122 may be a ground plane or a plane connected to a specific voltage. In the present embodiment, the two reference planes 120 and 122 are located on the planes 124 and 126 at upper and lower sides (where the two differential transmission line pairs 102a and 102b are located), respectively. However, relative positions of the reference planes 120 and 122 to the planes 124 and 126 where the upper and lower differential transmission line pairs 102a and 102b are located are not limited to the above as long as one of the reference planes 120 or 122 is located above or below the plane 124 where the differential transmission line pair 102a is located, or located above or below the plane 126 where the differential transmission line pair 102b is located. In other embodiments, it is also possible that the multi-layer circuit structure 100 includes only one reference plane (120, or 122), so the two conductive patterns 130a and 130b respectively located on the planes 124 and 126 may also be electrically connected to the same reference plane (120, or 122).

Figure 4:
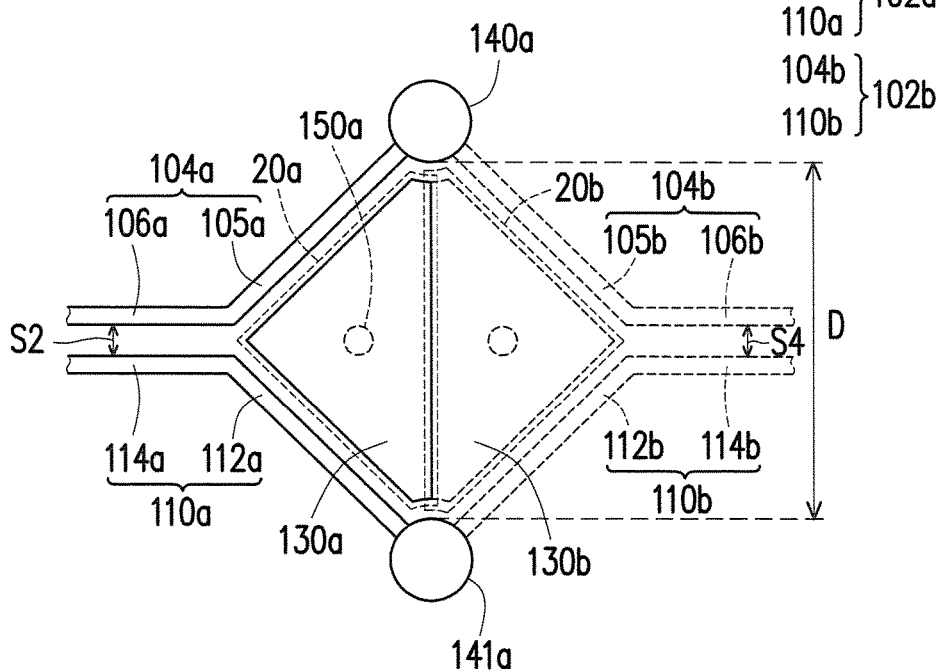
FIG. 4 is a schematic partial top view of the multi-layer circuit structure of FIG. 3.

FIG. 4 is a schematic partial top view of the multi-layer circuit structure of FIG. 3. It should be noted, because the two differential transmission line pairs 102a and 102b are respectively located on the planes 124 and 126, the circuits located on the lower planes are intentionally illustrated by dotted lines in the top view of FIG. 4 so the circuits on the different planes may be distinguished. In view of FIG. 4, in the present embodiment, projections of the two conductive patterns 130a and 130b are not overlapping with each other on the plane 124 (shown in FIG. 3) where the differential transmission line pair 102a is located, and are symmetrical to each other based on a connecting line of the first differential pad 140a and the second differential pad 141a located on the plane 124. In FIG. 4, an overall outline of the two conductive patterns 130a and 130b shows a shape close to a square and shows the corresponding curved shapes at positions close to the first differential pad 140a and the second differential pad 141a. In view of FIG. 4, the conductive pattern 130a maintains the fixed spacing with each of the first segment 105a of the first transmission line 104a and the first segment 112a of the second transmission line 110a, and the conductive pattern 130b maintains the fixed spacing with each of the first segment 105b of the first transmission line 104b and the first segment 112b of the second transmission line 110b. Accordingly, impedance matching state of the first segment 105a of the first transmission line 104a and the first segment 112a of the second transmission line 110a having the non-fixed spacing S1 (shown in FIG. 3) in between may be regulated, and impedance matching state of the first segment 105b of the first transmission line 104b and the first segment 112b of the second transmission line 110b having the non-fixed spacing S3 (shown in FIG. 3) in between may be regulated.

Figure 5:
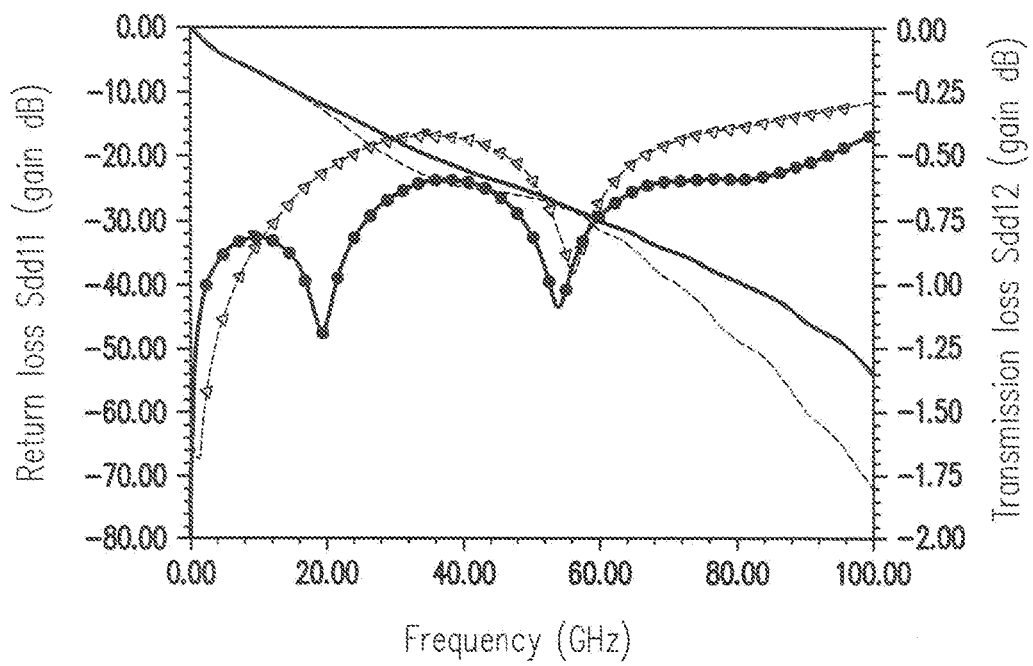
FIG. 5 and FIG. 7 are schematic diagrams of a frequency-differential return loss (Sdd11) and a frequency-differential transmission loss (Sdd12) for the two conventional multi-layer circuit structures and the multi-layer circuit structure of the present disclosure, respectively.
Figure 6:
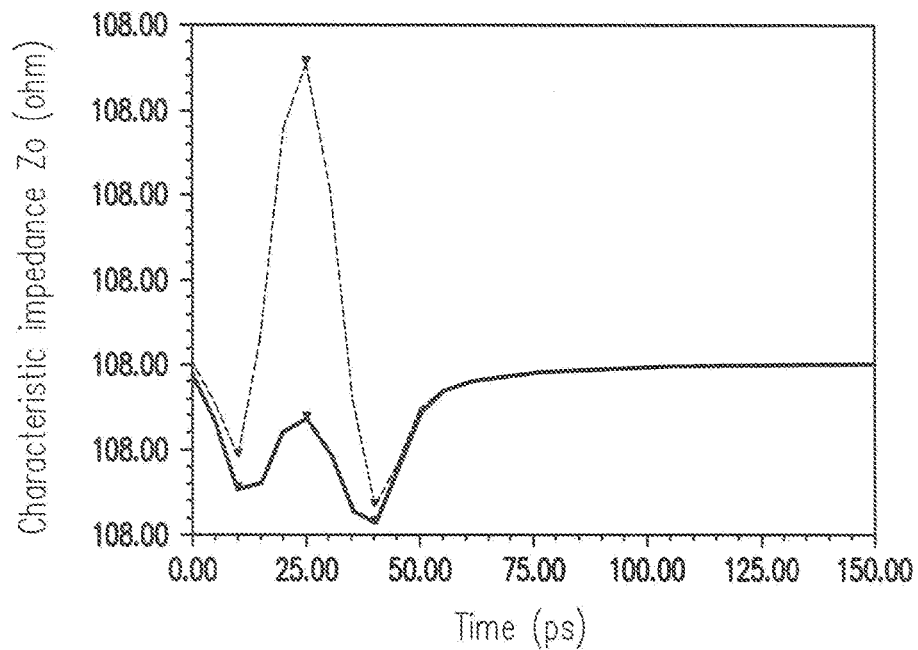
FIG. 6 and FIG. 8 are schematic diagrams of a time-characteristic impedance for the two conventional multi-layer circuit structures and the multi-layer circuit structure of the present disclosure, respectively.
Figure 7:
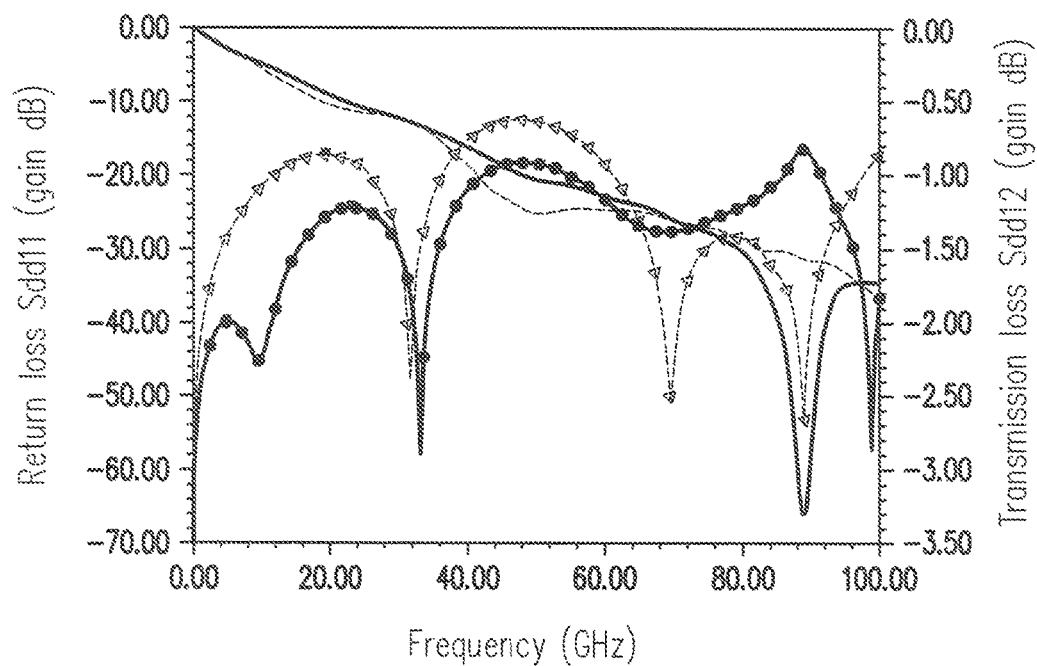
Figure 8:
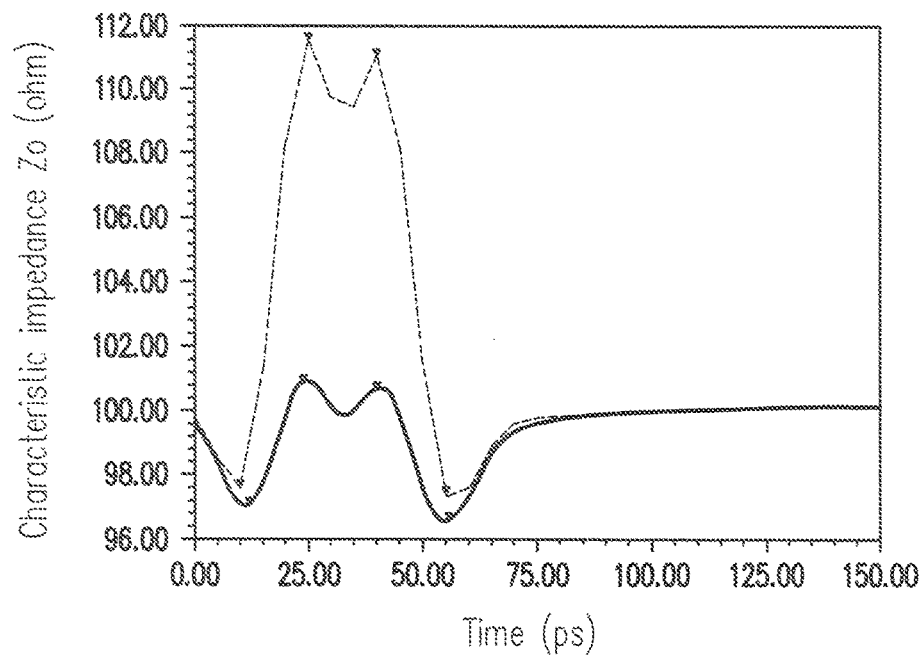

FIG. 5 and FIG. 7 are schematic diagrams of a frequency-differential return loss (Sdd11) and a frequency-differential transmission loss (Sdd12) for the two conventional multi-layer circuit structures 10 and the multi-layer circuit structure 100 shown in FIG. 3 and FIG. 4, respectively. FIG. 6 and FIG. 8 are schematic diagrams of a time-characteristic impedance for the two conventional multi-layer circuit structures 10 and the multi-layer circuit structure 100 shown in FIG. 3 and FIG. 4, respectively. It should be noted that, in FIG. 5 to FIG. 8, a simulation curve of the conventional multi-layer circuit structure 10 is represented by a thin dotted line, and a simulation curve of the multi-layer circuit structure 100 shown in FIG. 3 and FIG. 4 is represented by a thick solid line.

Figure 1:
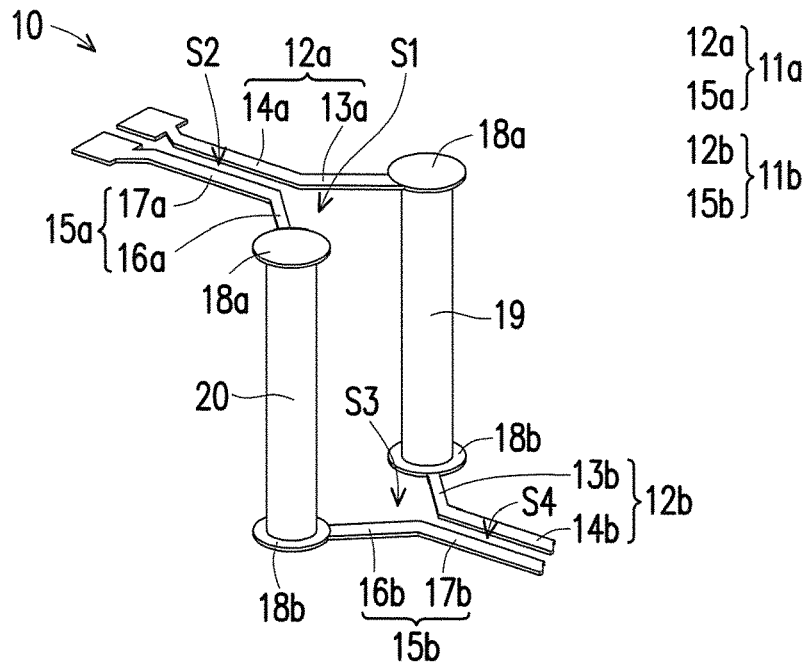
FIG. 1 is a schematic partial view of a conventional multi-layer circuit structure.
Figure 2:
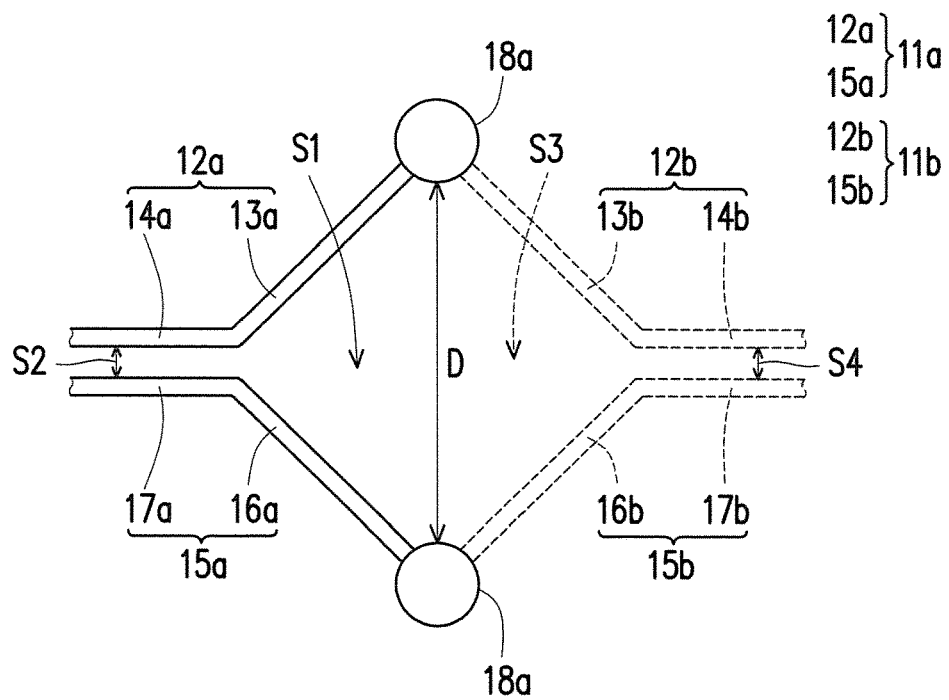
FIG. 2 is a schematic partial top view of the multi-layer circuit structure of FIG. 1.

The conventional multi-layer circuit structure 10 refers to the multi-layer circuit structure shown in FIG. 1 and FIG. 2, for example. For example, if the distance D (marked in FIG. 2) between the first differential pad 140a and the second differential pad 140b is 50 mil and the differential transmission line has a line width of 4 mil and a line spacing S2 of 8 mil, in view of FIG. 5, when a frequency f=36 GHz, the return loss (Sdd11) of the conventional multi-layer circuit structure 10 is approximately −16.8 (gain dB) and the return loss (Sdd11) of the multi-layer circuit structure 100 shown in FIG. 3 and FIG. 4 is approximately −24 (gain dB). In view of FIG. 6, the characteristic impedance of the conventional multi-layer circuit structure 10 is approximately 107 ohm, and the characteristic impedance of the multi-layer circuit structure 100 of the present embodiment is approximately 99 ohm.

As another example, if the distance D between the first differential pad 140a and the second differential pad 140b is 80 mil and the differential transmission line has a line width of 4 mil and a line spacing S4 of 8 mil, in view of FIG. 7, when a frequency f=20 GHz, the return loss (Sdd11) of the conventional multi-layer circuit structure 10 is approximately −17 (gain dB) and the return loss (Sdd11) of the multi-layer circuit structure 100 shown in FIG. 3 and FIG. 4 is approximately −24 (gain dB). In view of FIG. 8, the characteristic impedance of the conventional multi-layer circuit structure 10 is approximately 111 ohm, and the characteristic impedance of the multi-layer circuit structure 100 of the present embodiment is approximately 100.9 ohm.

According to simulation results in FIG. 5 to FIG. 8, as compared to the conventional multi-layer circuit structure 10, it can be known that in the multi-layer circuit structure 100 of the present embodiment, the impedance between the first segment 105a of the first transmission line 104a and the first segment 112a of the second transmission line 110a in the differential transmission line pair 102a can be regulated and controlled through the conductive pattern 130a; and the impedance between the first segment 105b of the first transmission line 104b and the first segment 112b of the second transmission line 110b in the differential transmission line pair 102b can be regulated and controlled through the conductive pattern 130b, such that the differential return loss and the impedance may be effectively reduced.

Naturally, the position and manner for disposing the conductive patterns 130a and 130b are not limited to the above. FIG. 9 to FIG. 12 are schematic partial top views of various multi-layer circuit structures according to other embodiments of the present disclosure. It should be noted that, elements similar or identical to those in the previous embodiment are marked with identical or similar reference numbers in the following drawings, and descriptions regarding the same are not repeated hereinafter.

Figure 9:
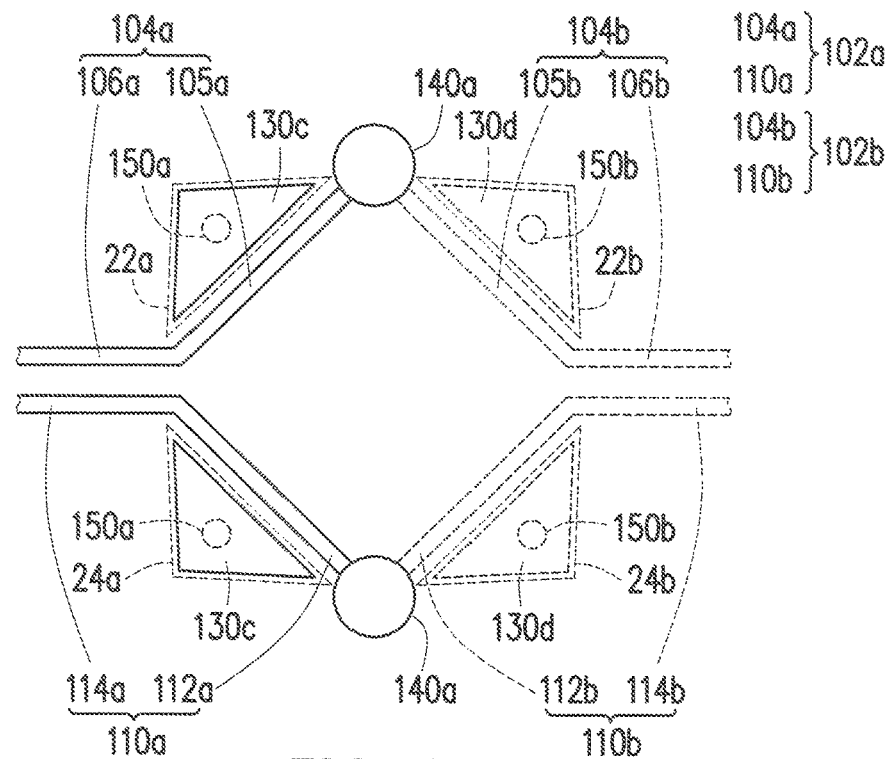
FIG. 9 to FIG. 12 are schematic partial top views of various multi-layer circuit structures according to other embodiments of the present disclosure.

Referring to FIG. 9 first, in the present embodiment, a second zone 22a is defined at outside the first segment 105a of the first transmission line 104a, a third zone 24a is defined at outside the first segment 112a of the second transmission line 110a, the second zone 22a is opposite to the first zone 20a (marked in FIG. 4) and located on one side of the first segment 105a of the first transmission line 104a, and the third zone 24a is opposite to the first zone 20a (marked in FIG. 4) and located on one side of the first segment 112a of the second transmission line 110a. In the multi-layer circuit structure, two conductive patterns 130c are provided on the same plane 124 (marked in FIG. 3) of the differential transmission line pair 102a. The two conductive patterns 130c are located on the second zone 22a and the third zone 24a, respectively.

Similarly, a second zone 22b is defined at outside the first segment 105b of the first transmission line 104b, a third zone 24b is defined at outside the first segment 112b of the second transmission line 110b, the second zone 22b is opposite to the first zone 20b (marked in FIG. 4) and located on one side of the first segment 105b of the first transmission line 104b, and the third zone 24b is opposite to the first zone 20b (marked in FIG. 4) and located on one side of the first segment 112b of the second transmission line 110b. In the multi-layer circuit structure, two conductive patterns 130d are provided on the same plane 126 (marked in FIG. 3) of the differential transmission line pair 102b. The two conductive patterns 130d are located on the second zone 22b and the third zone 24b, respectively.

Figure 10:
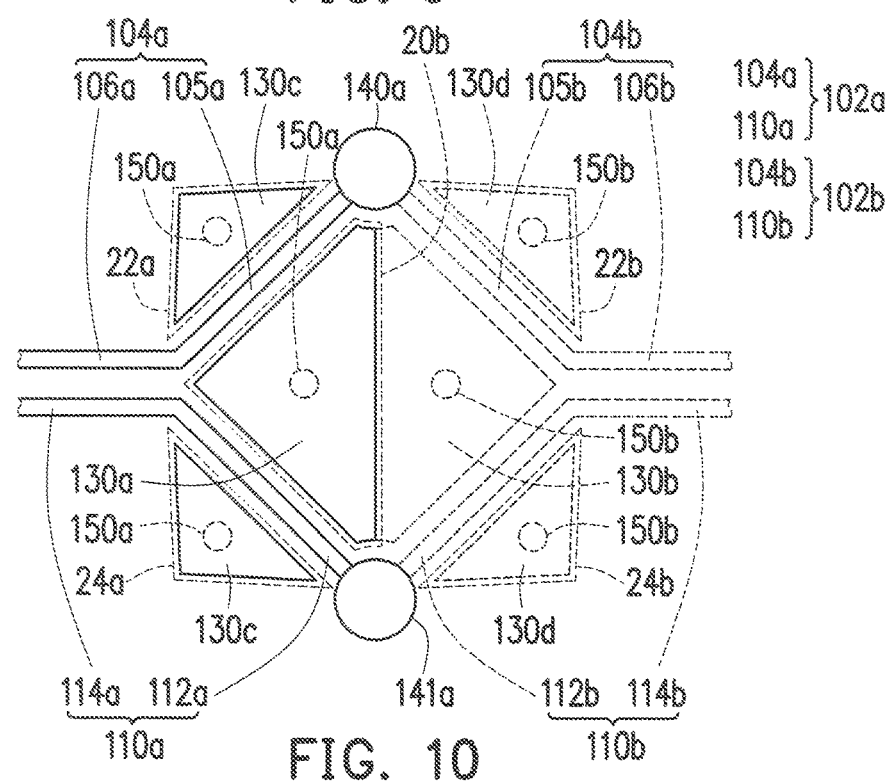

Referring to FIG. 10, in the present embodiment, in the multi-layer circuit structure, three conductive patterns (130a, 130c) are provided on the same plane 124 (marked in FIG. 3) of the differential transmission line pair 102a, where one of the conductive patterns (130a) is located on the first zone 20a (at the same position as in FIG. 4). The other two conductive patterns 130c are located on the second zone 22a and the third zone 24a (at the same positions as in FIG. 9), respectively. Similarly, the conductive patterns (130a, 130c) have outlines corresponding to the outlines of the first segment 105a of the first transmission line 104a and the first segment 112a of the second transmission line 110a, and maintain the same spacing with each of the first segment 105a of the first transmission line 104a and the first segment 112a of the second transmission line 110a.

Similarly, in the multi-layer circuit structure, three conductive patterns (130b, 130d) are provided on the same plane 126 of the differential transmission line pair 102b, where one of the conductive patterns (130b) is located on the same position as in FIG. 4, that is, located on the first zone 20b. The other two conductive patterns 130d are located on the same positions of FIG. 9, that is, located on the second zone 22b and the third zone 24b, respectively. Similarly, the conductive patterns (130b, 130d) have outlines corresponding to the outlines of the first segment 105b of the first transmission line 104b and the first segment 112b of the second transmission line 110b, and maintain the same spacing with each of the first segment 105b of the first transmission line 104b and the first segment 112b of the second transmission line 110b.

Figure 11:
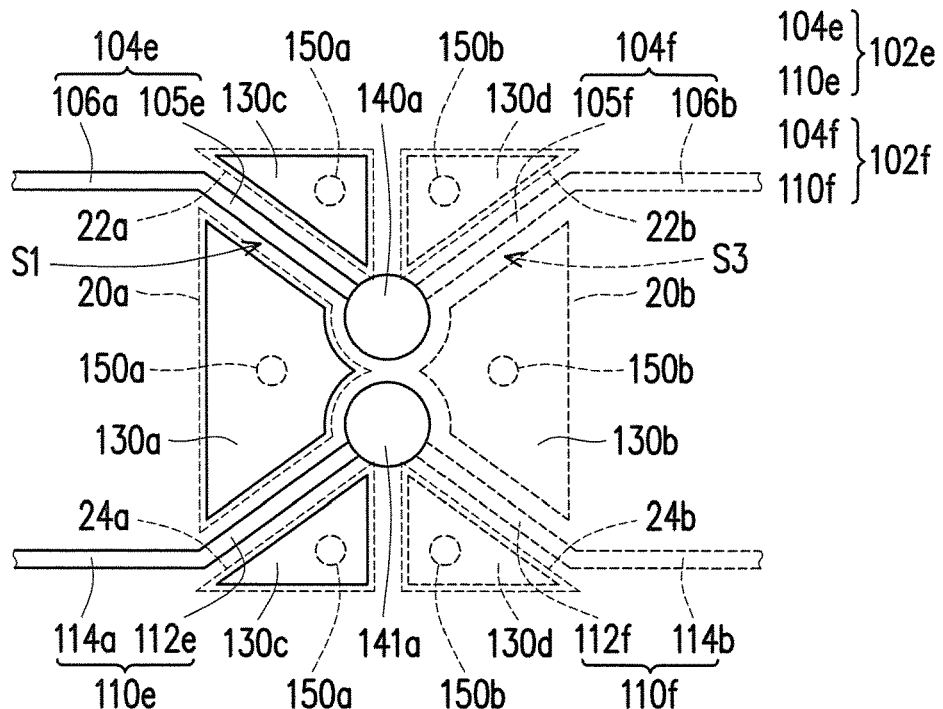

Referring to FIG. 11, the major difference between FIG. 11 and FIG. 10 is that, in the present embodiment, an spacing S1 between a first segment 105e of a first transmission line 104e and a first segment 112e of a second transmission line 110e decreases when being farther away from the second segment 106a of the first transmission line 104e and the second segment 114a of the second transmission line 110e. In FIG. 11, three conductive patterns (130a, 130c) are also provided on the same plane 124 (marked in FIG. 3) of a differential transmission line pair 102e, where the conductive pattern 130a is located on the first zone 20a, and the upper and lower conductive patterns 130c are located on the second zone 22a and the third zone 24a, respectively. Similarly, the conductive patterns (130a, 130c) have outlines corresponding to outlines of the first segment 105e of the first transmission line 104e and the first segment 112e of the second transmission line 110e, and the conductive pattern 130a maintains the same spacing with each of the first segment 105e of the first transmission line 104e, the first segment 112e of the second transmission line 110e, the first differential pad 140a and the second differential pad 141a. Also, the upper conductive pattern 130c maintains a fixed spacing with the first segment 105e of the first transmission line 104e, and the lower conductive pattern 130c maintains a fixed spacing with the first segment 112e of the second transmission line 110e.

Similarly, a spacing S3 between a first segment 105f of a first transmission line 104f and a first segment 112f of a second transmission line 110f decreases when being farther away from the second segment 106b of the first transmission line 104f and the second segment 114b of the second transmission line 110f. In FIG. 11, three conductive patterns (130b, 130d) are also provided on the same plane of a differential transmission line pair 102f, where the conductive pattern 130b is located on the first zone 20b, and the upper and lower conductive patterns 130d are located on the second zone 22b and the third zone 24b, respectively. The conductive patterns (130b, 130d) have outlines corresponding to outlines of the first segment 105f of the first transmission line 104f and the first segment 112f of the second transmission line 110f, and the conductive pattern 130b maintains the same spacing with each of the first segment 105f of the first transmission line 104f, the first segment 112f of the second transmission line 110f, the first differential pad 140a and the second differential pad 141a. Each of the upper and lower conductive patterns 130d maintains a fixed spacing with the first segment 105f of the first transmission line 104f and the first segment 112f of the second transmission line 110f.

Figure 12:
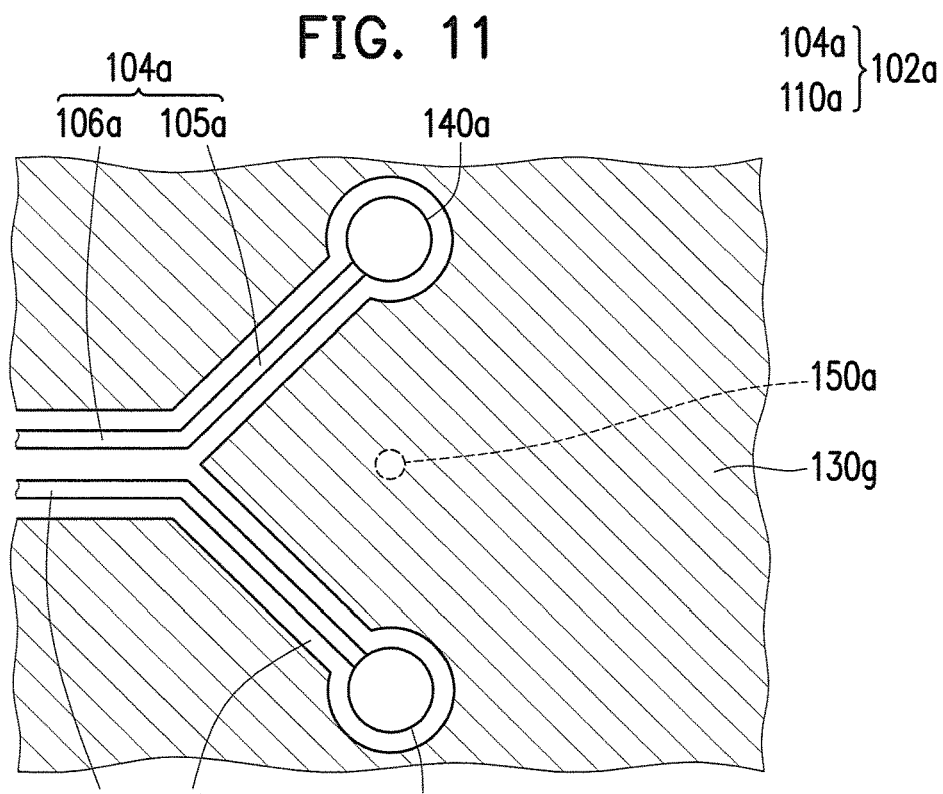

Referring to FIG. 12, forms of the first transmission line 104a and the second transmission line 110a in FIG. 12 are identical to forms of the first transmission line 104a and the second transmission line 110a in FIG. 10. The difference between FIG. 12 and FIG. 10 is that, in the present embodiment, a conductive pattern 130g surrounds outside the first transmission line 104a, outside the second transmission line 110a, the first differential pad 140a and the second differential pad 141a, and located on a portion between the first segment 105a of the first transmission line 104a and the first segment 112a of the second transmission line 110a. More specifically, the conductive pattern 130g is located on one side of the first transmission line 104a away from the second transmission line 110a and on one side of the second transmission line 110a away from the first transmission line 104a, extended to a right-half portion of FIG. 12 bypassing around the first differential pad 140a and the second differential pad 141a, and extended into the portion between the first segment 105a of the first transmission line 104a and the first segment 112a of the second transmission line 110a. Also, the conductive pattern 130g is electrically insulated to the first transmission line 104a, the second transmission line 110a, the first differential pad 140a and the second differential pad 141a. In the present embodiment, the conductive pattern 130g maintains a fixed spacing with each of the first segment 105a of the first transmission line 104a, the first segment 112a of the second transmission line 110a, the first differential pad 140a and the second differential pad 141a.

In addition, it is noted that, positions of the conductive patterns 130a, 130b, 130c, 130d and 130g, the first differential pads 140a and 140b, and the second differential pads 141a and 141b in the multi-layer circuit structure 100 may be on a surface or in an inner layer. Although the conductive pattern 130a and the first differential pad 140a are taken as an example below, the same description may also be applied to the conductive patterns 130b, 130c, 130d and 130g, the first differential pad 140b, and the second differential pads 141a and 141b.

Figure 13:
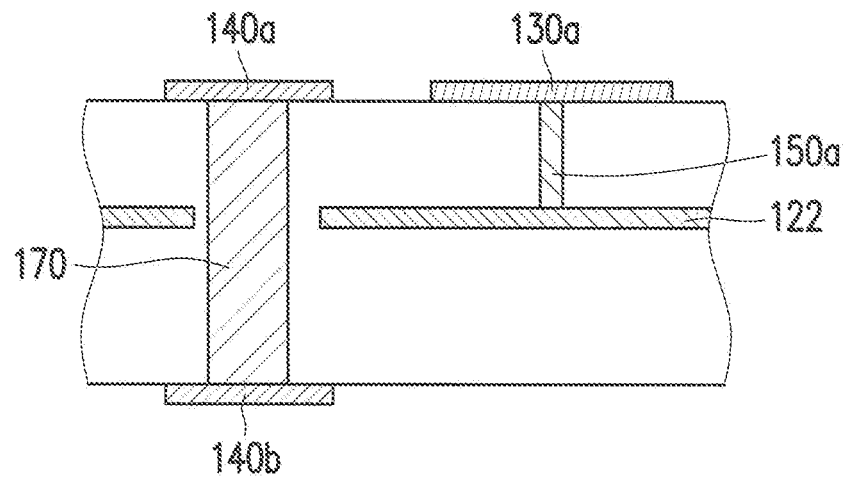
FIG. 13, FIG. 14 and FIG. 15 are schematic partial sectional views according to three embodiments of the present disclosure.
Figure 14:
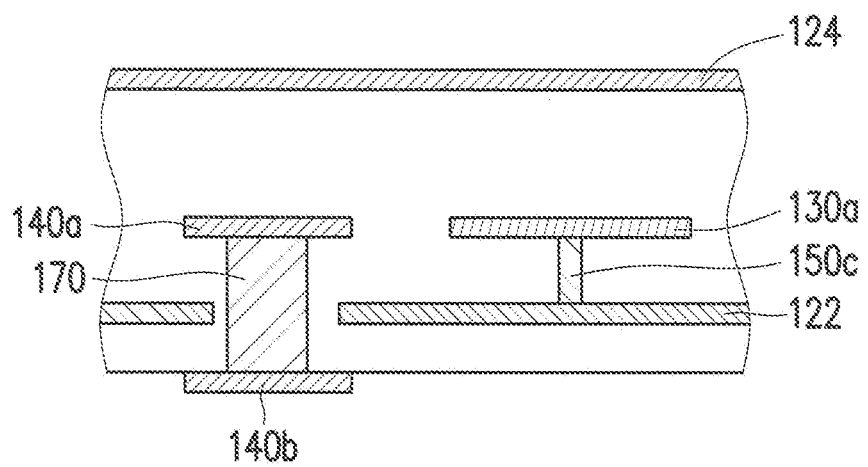
Figure 15:
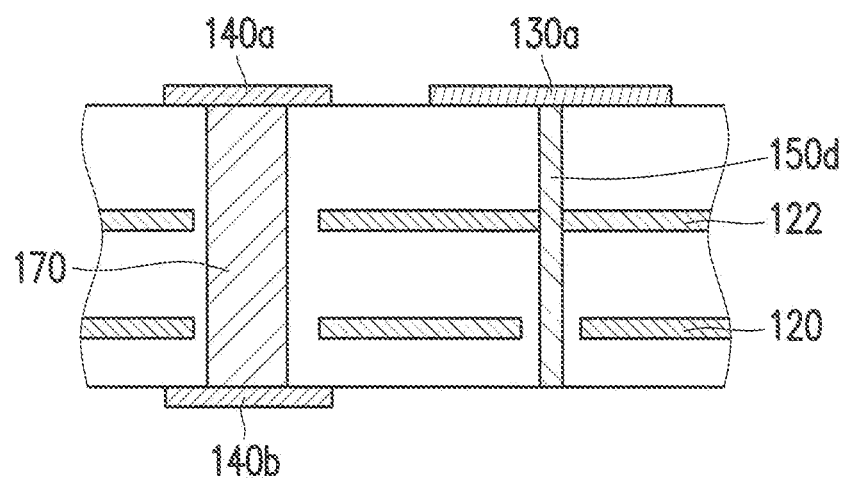

FIG. 13, FIG. 14 and FIG. 15 are schematic partial sectional views according to three embodiments of the present disclosure. Referring to FIG. 13, in the present embodiment, the conductive pattern 130a may be a microstrip circuit located on a surface of the multi-layer circuit structure 100 and electrically connected to the reference plane 122 located inside through the blind via 150a. Alternatively, as shown in FIG. 14, in the present embodiment, the conductive pattern 130a may also be a stripline circuit located inside the multi-layer circuit structure 100 and electrically connected to the reference plane 122 located below (or above) the conductive pattern 130a through a buried via 150c. Alternatively, as shown in FIG. 15, in the present embodiment, the conductive pattern 130a may also be a microstrip circuit electrically connected to the reference plane 122 through a plated through hole 150d.

In summary, in the differential transmission line pairs of the multi-layer circuit structure according to the present disclosure, the spacing between the first segment of the first transmission line and the first segment of the second transmission line is non-fixed, a region between the first segment of the first transmission line and the first segment of the second transmission line is defined as the first zone, a region opposite to the first zone and located on one side of the first segment of the first transmission line is defined as the second zone, and a region opposite to the first zone and located on one side of the first segment of the second transmission line is defined as the third zone. Then, by disposing the conductive pattern on at least one of the first zone, the second zone and the third zone of the differential transmission line pair where the conductive pattern is electrically connected to the reference plane and electrically insulated from the differential transmission line pair, the impedance control of the differential transmission line pair at the segments having the non-fixed spacing may be improved. As a result, the effects of reducing impedance discontinuity, lowering high frequency signal reflection and improving signal integrity may be achieved.

Although the present disclosure has been described with reference to the above embodiments, it is apparent to one of the ordinary skill in the art that modifications to the described embodiments may be made without departing from the spirit of the present disclosure. Accordingly, the scope of the present disclosure will be defined by the attached claims not by the above detailed descriptions.

The invention claimed is:

1. A multi-layer circuit structure, comprising:

two sets of differential transmission line pairs, each comprising a first transmission line and a second transmission line disposed side by side, each of said first transmission line and said second transmission line comprising a first segment and a second segment connected to each other, a spacing between said first segment of said first transmission line and said first segment of said second transmission line being non-fixed, the spacing between said second segment of said first transmission line and said second segment of said second transmission line being fixed, a first zone located between said first segment of said first transmission line and said first segment of said second transmission line, a second zone opposite to said first zone and located on one side of said first segment of said first transmission line, a third zone opposite to said first zone and located on one side of said first segment of said second transmission line; and two sets of at least one conductive patterns, each coplanar with said differential transmission line pair and located on at least one of said first zone, said second zone and said third zone, said at least one conductive pattern being electrically connected to a reference potential and electrically insulated from said differential transmission line pair, wherein one of said two sets of said differential transmission line pair and one of said two sets of at least one conductive pattern are located on one plane, the other one of said two sets of said differential transmission line pair and the other one of said two sets of at least one conductive pattern are located on another plane, wherein projections of said two sets of at least one conductive patterns are not overlapping with each other on said one plane where one of said two sets of said differential transmission line pairs is located.

2. The multi-layer circuit structure according to claim 1, wherein said at least one conductive pattern is located on said first zone of said differential transmission line pair.

3. The multi-layer circuit structure according to claim 1, wherein said at least one conductive pattern comprises a plurality of conductive patterns, and said plurality of conductive patterns are located on said second zone and said third zone of said differential transmission line pair.

4. The multi-layer circuit structure according to claim 1, wherein said at least one conductive pattern comprises a plurality of conductive patterns, a part of said plurality of conductive patterns is located on said first zone of said differential transmission line pair, and the other part of said plurality of conductive patterns is located on said second zone and said third zone of said differential transmission line pair.

5. The multi-layer circuit structure according to claim 1, wherein an outline of said at least one conductive pattern corresponds to an outline of said first segment.

6. The multi-layer circuit structure according to claim 1, further comprising: a reference plane having said reference potential, said reference plane being located above or below said differential transmission line pair, said at least one conductive pattern being electrically connected to said reference plane.

7. The multi-layer circuit structure according to claim 1, further comprising: a reference plane having said reference potential, said reference plane being located directly above or directly below said at least one conductive pattern, said at least one conductive pattern being electrically connected to said reference plane.

8. The multi-layer circuit structure according to claim 7, wherein said at least one conductive pattern is a microstrip circuit connected to said reference plane through a blind via.

9. The multi-layer circuit structure according to claim 7, wherein said at least one conductive pattern is a stripline circuit connected to said reference plane through a buried via.

10. The multi-layer circuit structure according to claim 7, wherein said at least one conductive pattern is a microstrip circuit connected to said reference plane through a plated through via.

11. The multi-layer circuit structure according to claim 1, further comprising:

two sets of first differential pads, each connected to said first segment of said first transmission line; and two sets of second differential pads, each connected to said first segment of said second transmission line, an interval between said first differential pad and said second differential pad being greater than or less than said spacing between said second segment of said first transmission line and said second segment of said second transmission line.

12. The multi-layer circuit structure according to claim 11, wherein one of said two first differential pads, and one of said two second differential pads are located on one plane, the other one of said two first differential pads, and the other one of said two second differential pads are located on another plane, said two first differential pads are electrically connected, and said two second differential pads are electrically connected.

13. The multi-layer circuit structure according to claim 12, wherein projections of said two sets of said conductive patterns are symmetrical to each other based on a connecting line of said first differential pad and said second differential pad located on said one plane.

14. The multi-layer circuit structure according to claim 1, wherein said spacing between said first segment of said first transmission line and said first segment of said second transmission line increases or decreases when being farther away from said second segment of said first transmission line and said second segment of said second transmission line.

* * * * *